US010126374B2

(12) United States Patent
Novak

(10) Patent No.: US 10,126,374 B2
(45) Date of Patent: Nov. 13, 2018

(54) UNIVERSAL POWER DISTRIBUTION TEST TOOL AND METHODOLOGY

(71) Applicant: Oracle International Corporation, Redwood Shores, CA (US)

(72) Inventor: Istvan Novak, Bedford, MA (US)

(73) Assignee: Oracle International Corporation, Redwood Shores, CA (US)

( * ) Notice: Subject to any disclaimer, the term of this patent is extended or adjusted under 35 U.S.C. 154(b) by 87 days.

(21) Appl. No.: 15/215,280

(22) Filed: Jul. 20, 2016

(65) Prior Publication Data
US 2018/0024204 A1 Jan. 25, 2018

(51) Int. Cl.
G01R 31/40 (2014.01)
G01R 13/20 (2006.01)
G01R 31/44 (2006.01)

(52) U.S. Cl.
CPC ............ G01R 31/40 (2013.01); G01R 13/20 (2013.01); G01R 31/44 (2013.01)

(58) Field of Classification Search
CPC .............. G01R 31/42; G01R 31/31924; G01R 19/16538; G01R 31/40; G01R 13/20
See application file for complete search history.

(56) References Cited

U.S. PATENT DOCUMENTS 5,311,116 A * 5/1994 Rogers ................. G01R 31/002
324/627
2009/0222234 A1* 9/2009 Dmitriev-Zdorov .......................
H04L 12/2697
702/119

OTHER PUBLICATIONS

Steve Sandler, Heidi Barnes, "Introduction to Power Integrity," DesignCon 2016, Jan. 19-21, 2016, Santa Clara, CA.
Radhakrishnan, et al, "Optimization of Package Power Delivery and Power Removal Solutions to meet Platform level Challenges," Intel Developer Forum, 2004.

* cited by examiner

Primary Examiner — Patrick Assouad
Assistant Examiner — Haidong Zhang
(74) Attorney, Agent, or Firm — Invoke

(57) ABSTRACT

Methodologies and systems are described herein whereby the electrical performance of a device may be tested. In one or more embodiments, a system for testing the electrical performance comprises a monitoring device configured to perform a set of operations including concurrently monitoring at least three different test points of a device under test (DUT) and aggregating test data comprising signal information collected concurrently from at least three different test points of the DUT. In one or more embodiments, the system is configured to monitor at least three channels wherein at least one channel corresponds to a frequency range of less than 300 kHz and the phases of signals on at least three channels are different.

20 Claims, 5 Drawing Sheets

UNIVERSAL POWER DISTRIBUTION TEST TOOL AND METHODOLOGY

TECHNICAL FIELD

The present disclosure relates to systems and methods for testing the electrical performance of power distribution networks. In particular, the present disclosure relates to techniques for collecting and aggregating test data from a set of test points of a device under test (DUT) to evaluate various aspects of power distribution within the DUT.

BACKGROUND

Power distribution involves the transfer of energy from a powers source to one or more electric load points. In the context of an electronic device or system, for instance, a power distribution network (PDN) may include, but is not limited to, an alternating current (AC) and/or direct current (DC) power supply to produce electric energy, supply rails to distribute the power from the power supply to one or more electrical components (the load point(s)) within the device/system, bypass capacitors to dampen or eliminate transient noise, hold-up converters to provide clean power in the event of temporary power spikes or drop-offs, and/or control circuitry to help maintain power integrity within the system. Power distribution networks that are sub-optimally or improperly designed may have a significant impact on system operation and performance. In the worst case scenario, components of an electronic device may be damaged and cease to operate properly due to a faulty PDN design. In less severe scenarios, an improper or suboptimal design may result in excess transient noise, current imbalance, transfer function errors, and/or undesired impedance levels.

In order to validate and improve PDN designs, power engineers typically perform a set of tests on a prototype device in which the PDN is integrated. For example, a power engineer may run a first set of tests to detect transient noises, a second set of tests to determine impedance levels within the device, and a third set of tests to validate the power block transfer functions. Generally, each separate test involves different instrumentation, test setup, connections/probing and test methodology. For instance, the power engineer may connect an oscilloscope and transient source to a device under test (DUT) to analyze the transient response to a step-current load. Once complete, the power engineer may then move on to test the output impedance of the DUT by removing the probes and disconnecting the test equipment, connecting a dedicated impedance analyzer or vector network analyzer to the DUT, calibrating the impedance analyzer or vector network analyzer, and running a set of impedance tests on the DUT using the test equipment. A similar process may be performed for other tests, with the power engineer changing connections and test methodologies for each separate task.

While relying on different instrumentation allows for dedicated test equipment to be leveraged, the process of switching from one device to another may be cumbersome and prone to error. For each separate test, the power engineer is required to ensure that the test equipment has been set up and connected correctly, and that the testing methodology has been properly defined. Some test equipment, such as frequency response analyzers and vector network analyzers, require detailed calibration and skilled operators to function correctly. Power engineers that are unfamiliar with such test equipment risk incorrectly performing a validation test on the PDN or even overlooking the validation test itself.

In other cases, the set of test equipment available to a power engineer may not be able to perform all of the validation tasks required to thoroughly analyze and validate the PDN design. For instance, frequency-domain based data acquisition tools, such as frequency response analyzers and vector network analyzers, are typically limited to testing linear circuits or linearized testing of nonlinear circuits. Further these frequency-domain based tools typically have a relatively high low end cutoff frequency, which restricts their ability to be used for analyzing baseband and other low-frequency signals.

By comparison, time-domain based data acquisition tools generally require less calibration to operate than frequency-domain based tools and can measure non-linear responses. However, these tools often have limitations of their own. For example, traditional oscilloscopes have a much more limited range in accuracy and dynamic range than frequency response analyzers. In addition, many oscilloscopes are limited to four or fewer analog channels, which restricts the types of testing these devices are able to perform. Some power engineers attempt to address the deficiencies of traditional oscilloscopes by using a custom hardware chip as an interface between each channel of the oscilloscope and the DUT. However, not all power engineers have the time, expertise, or resources to develop such custom hardware. Due to such limitations and complexities in the test equipment and methodologies, power engineers face many potential pitfalls when attempting to validate a PDN design. If a validation task is overlooked or improperly performed, the analysis of the electrical performance of a DUT may be faulty or incomplete. As a results, suboptimal or faulty PDN designs may be inadvertently integrated and shipped in an end product.

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

BRIEF DESCRIPTION OF THE DRAWINGS

The embodiments are illustrated by way of example and not by way of limitation in the figures of the accompanying drawings. It should be noted that references to "an" or "one" embodiment in this disclosure are not necessarily to the same embodiment, and they mean at least one. In the drawings.

DETAILED DESCRIPTION

Figure 1:
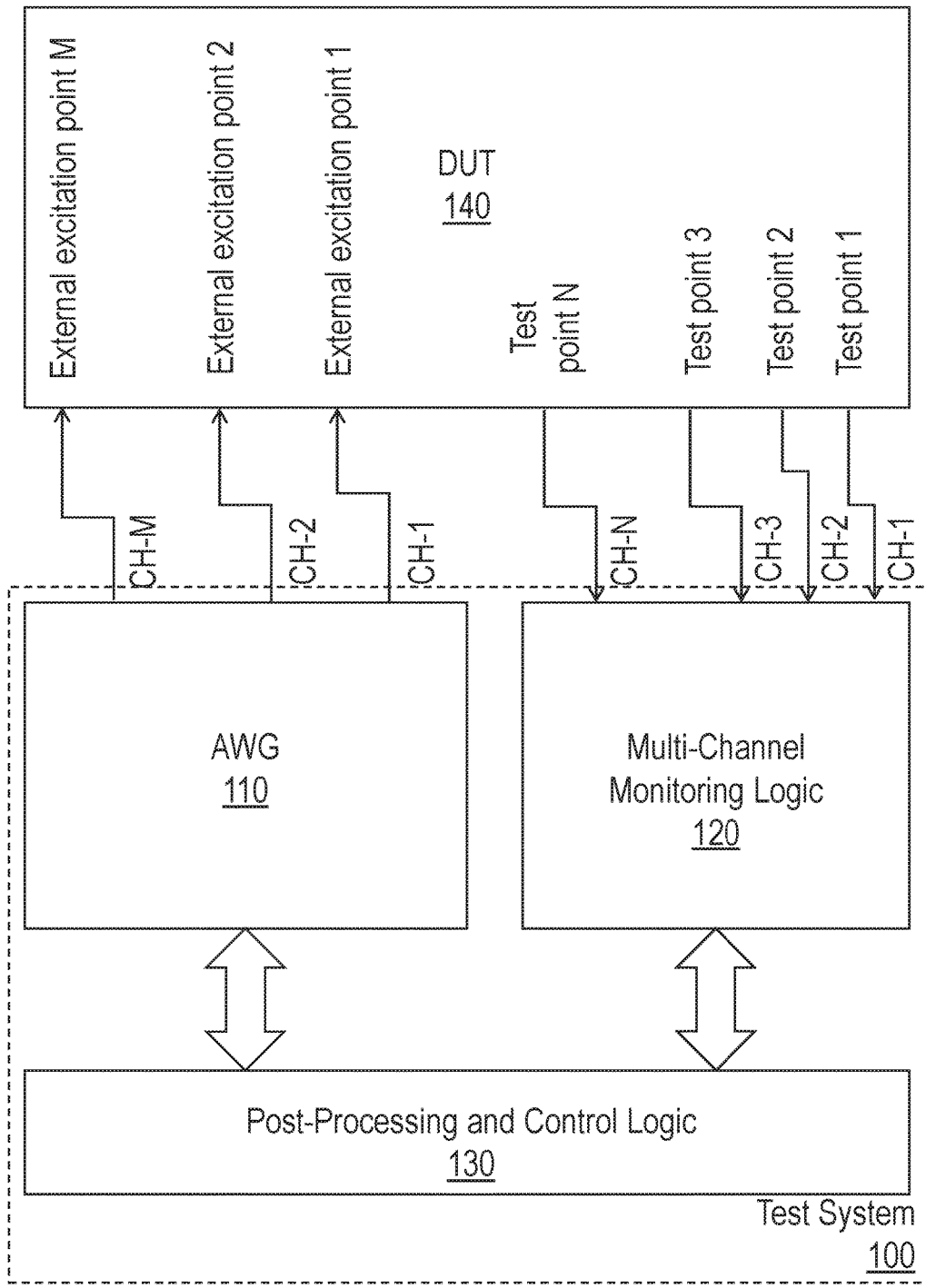
FIG. 1 illustrates a system for testing the electrical performance of a device under test in accordance with one or more embodiments.

In the following description, for the purposes of explanation, numerous specific details are set forth in order to provide a thorough understanding. One or more embodiments may be practiced without these specific details. Features described in one embodiment may be combined with features described in a different embodiment. In some examples, well-known structures and devices are described with reference to a block diagram form in order to avoid unnecessarily obscuring the present invention.
1. GENERAL OVERVIEW
2. ARCHITECTURAL OVERVIEW
3. VALIDATION TESTS
4. PERFORMANCE EVALUATION OF MULTI-PHASE POWER SUPPLIES
5. HARDWARE OVERVIEW
6. MISCELLANEOUS; EXTENSIONS

1. GENERAL OVERVIEW

Methodologies and systems are described herein whereby the electrical performance of power distribution networks (PDNs) may be tested. The electrical performance may be tested based on the evaluation and post-processing of time-domain measured data, of a Device Under Test (DUT), collected at one or more accessible test points. The electrical performance may be a result of intentional external excitation and/or internal stimuli. The methodologies and systems allow a user to perform a variety of validation tasks on a PDN design using the same instrumentation used to test the electrical performance. Using the same instrumentation reduces the complexity and costs in comparison to using different sets of instrumentation to validate a PDN design and test electrical performance. The methodologies and systems described herein further allow for validation tasks to be performed over a wide band of frequencies with minimal to no pre-test calibration. Extensive calibration may still be used in accordance with one or more embodiments.

In one or more embodiments, a system for testing the electrical performance of a DUT comprises a monitoring device (e.g., a multi-channel oscilloscope) with a plurality of input channels that are configured to be electrically coupled to a plurality of test points of the DUT. The monitoring device further includes components for performing a set of operations comprising concurrently monitoring at least three different test points of the DUT and aggregating test data comprising signal information collected concurrently from at least three different test points of the DUT. Thus, the system may capture and aggregate test data originating from three or more different test points within the DUT.

In one or more embodiments, the monitoring device is configured to concurrently monitor and capture test data from signals that operate over a wide band of frequencies, phases, and/or amplitudes. For example, one or more of the channels may be configured to monitor low frequency signals such as frequencies less than 300 kilohertz (kHz) down to zero or near-zero frequencies. In the test cases where at least three different test points of a DUT are monitored, the monitoring may include:
   (a) monitoring a first channel, corresponding to a frequency range of less than 300 kHz, to detect a first signal at a first phase and a first amplitude.
   (b) monitoring a second channel to detect a second signal at a second phase and a second amplitude, and
   (c) monitoring a third channel to detect a third signal at a third phase and a third amplitude.
The frequency ranges, phases, and/or amplitude ranges of the first, second, and third signal may also be different from each other. This allows a wide array of validation tests to be performed on the test data, as further described herein.

In one or more embodiments, the system for testing the electrical performance of a DUT comprises an Arbitrary Waveform Generator (AWG) that provides a set of one or more input signals to the DUT. The AWG may rotate through one or more waveforms for each input signal as part of a simulation to test the performance of the DUT. While the AWG is injecting waveforms into one or more excitation points of the DUT, the monitoring device may concurrently monitor a plurality of test points. This allows the system to analyze the electrical performance of the DUT responsive to different excitation signals.

In one or more embodiments, the system is configured to execute post-processing software comprising functionality to process test data collected from at least three different test points in the DUT. The post-processing software may be configured to perform one or more validation tasks of a DUT using the set of aggregate data that was concurrently captured from a DUT. As discussed in further detail below, the validation tasks may include, but are not limited to transient noise testing, impedance testing, filter and/or power block transfer function testing, small and large signal stability testing of power source control loops, and/or evaluation of current sharing of multi-phase power sources. The results of these tests may be aggregated and displayed concurrently to an end user in order to provide an overall picture of the electrical performance of a DUT. The end user may thus run a single simulation and view the results of various performance metrics and the relationship(s) between them, if any. The performance results may be generated and viewed without necessarily changing any connections/probes, test equipment, and test methodology.

In one or more embodiments, the monitoring device is configured to capture time-domain measurements from the test points. Time-domain measurements are advantageous over frequency-domain based measurements. Time-domain measurements facilitate analysis of both linear and nonlinear responses to external excitation or internal stimuli. Further, if captured at a high enough resolution (e.g., a resolution above a particular threshold value), time-domain measurements allow for estimating frequency-domain based representations comparable to frequency-based measurements taken directly.

2. ARCHITECTURAL OVERVIEW

FIG. 1 illustrates a system for testing the electrical performance of a DUT in accordance with one or more embodiments. Test system 100 generally comprises AWG 110, multi-channel monitoring logic 120, and post-processing and control logic 130. Components of test system 100 may be implemented as part of the same device or on separate devices. For example, post-processing and control logic 130 may be configured to execute on a multi-channel monitoring device, such as an oscilloscope comprising one or more hardware processors. By integrating each of these components onto a single device, the amount of equipment involved in testing the electrical performance of DUT 140 may be minimized to a single piece of instrumentation. In other embodiments, post-processing and control logic 130 may execute on a computing device that is external to and communicatively coupled to the multi-channel monitoring device.

AWG 110 includes hardware logic or a combination of hardware and software logic used to generate and output any arbitrarily defined electrical waveform(s) over one or more channels. Each output channel in AWG 110 is electrically coupled during testing to a corresponding external excitation point of DUT 140. The electrical waveforms are injected by AWG 110 into DUT 140 through the corresponding external excitation point. The waveforms may comprise sine waves, square waves, test impulses, transient inputs, or any other arbitrary waveform. Further, the waveforms may correspond to a current source or a voltage source. This allows AWG 110 to inject a large range of signals into the device by varying the current and/or voltage waveforms at one or more excitation points.

In one or more embodiments, AWG 110 includes one or more components for varying the power of a signal injected into DUT 140 without distorting the waveform. For example, AWG 110 may include an attenuator that reduces the power of a signal provided to one or more external excitation points. In addition or alternatively, AWG 110 may include an amplifier to increase the power of the signal at the one or more external excitation points.

In one or more embodiments, AWG 110 includes one or more components for modulating the output waveform provided to DUT 140 along one or more channels. The components may include, but are not limited to a set of one or more voltage-controlled oscillators that control the frequency and/or phase of the output waveform. For instance, AWG 110 may comprise a first voltage-controlled oscillator that adjusts the frequency of a signal on a first channel in response to a first control voltage and a second voltage-controlled oscillator that adjusts the phase of the signal in response to a second control voltage. Additional voltage controlled oscillators may be used to control other channels between AWG 110 and DUT 140, if any. Thus, the phase and frequency of the signal injected into each external excitation point may be individually controlled.

AWG 110 may generate and inject waveforms into DUT 140 on a continuous or single-shot basis, depending on the particular configuration. If generating waveforms on a continuous basis, AWG 110 may be configured to inject the waveforms for: (a) a set amount of time, (b) indefinitely until an external trigger is received, or (c) DUT 140 is disconnected. Further, AWG 110 may be configured to sweep through different waveforms, such as by varying the phase, frequency, amplitude and/or shape of the waveform over predefined time intervals.

Multi-channel monitoring logic 120 includes hardware logic or a combination of hardware and software logic for capturing time-domain measurements over a plurality of channels. Each input channel is configured to be electrically coupled during the testing process to a corresponding test point within DUT 140. For instance, an input channel may be electronically coupled through a voltage and/or current probe. The waveforms that are monitored at a given test point may correspond to time-domain measurements of current, voltage, and/or other electrical properties, such that changes in these properties at the corresponding test point over time may be captured.

In one or more embodiments, multi-channel monitoring device is a high resolution multi-channel oscilloscope or subcomponent therein that is configured to capture time-domain measurements from three or more channels. A high resolution oscilloscope in this context refers to an oscilloscope having a resolution of at least twelve bits. High resolution oscilloscopes are able to capture a much wider range of frequencies over an input channel with much greater accuracy than a traditional 8-bit oscilloscope. For instance, a twelve-bit oscilloscope may be able to provide an additional 20 decibel spectral range while capturing signal details that would be missed by an eight-bit oscilloscope. The additional range and accuracy allow for a combination of time-domain and/or frequency-domain based validation tasks that are unavailable on traditional single-channel, eight-bit oscilloscope.

Post-processing and control logic 130 comprise software logic, hardware logic, or some combination thereof for initializing and controlling operation of AWG 110 and multi-channel monitoring logic 120. With respect to AWG 110, post-processing and control logic 130 may initialize and control the timing, amplitude, phase, frequency and/or other characteristics of a waveform that is injected into DUT 140. For example, control logic 130 may provide signals to one or more voltage controlled oscillators within AWG 110 such that the frequency and/or phase of a generated waveform may be controlled. As another example, control logic 130 may provide control signals to an attenuator and/or amplifier within AWG 110 to adjust the amplitude of a generated waveform. Post-processing and control logic 130 may also cause AWG 110 to sweep through signals having different frequencies, phases, amplitudes, and/or shapes at predefined timing intervals or in response to a sweep trigger.

With respect to multi-channel monitoring logic 120, post-processing and control logic 130 may initialize or otherwise define the parameters controlling how time-domain measurements (the "test data") are captured. For example, post-processing and control logic 130 may initialize voltage scales and the sweep parameters within a multi-channel oscilloscope. Other parameters may control how captured time-series data is displayed on the oscilloscope, such as the vertical and/or horizontal position of a displayed waveform, In one or more embodiments, post-processing and control logic 130 is configured to perform a set of validation tasks as described in further detail below. As part of the validation tasks, post-processing and control logic 130 may simulate various scenarios by adjusting the excitation signals provided to DUT 140 over one or more channels. For example, post-processing and control logic 130 may cause AWG 110 to step the current and/or voltage up and/or down at varying intervals, inject current and/or voltage transients into the excitation points, and vary the excitation points where external signals are injected. Post-processing and control logic 130 may then aggregate the test data captured by multi-channel monitoring logic 120 and evaluate the test data to generate a set of results for the validation tasks. These results may be stored in volatile and/or non-volatile storage and displayed to an end user, such as on the monitor of an oscilloscope or some other computing device.

DUT 140 may be any electronic device for which the electrical performance is to be evaluated by test system 100. DUT 140 may comprise a linear circuit and/or a non-linear circuit that is tested by test system 100. A "linear circuit" in this context refers to a circuit in which the output voltage is directly proportional to the input voltage. By contrast, in nonlinear circuits, the output voltage of the circuit is not directly proportional to the input voltage of the circuit. Example components that may introduce nonlinearity into a circuit may include, but is not limited to, transistors, such as metal-oxide-semiconductor field-effect transistors (MOSFETs) and bipolar junction transistors (BJTs), diodes, and transformers. Example circuits that may be nonlinear may include, but is not limited to, integrated circuits comprising MOSFETs, rectifiers, and some multi-phase power converters. By capturing time-domain measurements rather than frequency-based measurements, test system 100 may more effectively evaluate the nonlinear performance of an electrical circuit as the response may be more easily analyzed as a function of time.

In one or more embodiments, AWG 110 may be disabled or omitted from test system 100. In these implementations, test system 100 may be used to monitor the normal operation of DUT 140 without any external signals injected into the external excitation points. This configuration may be sufficient to validate the performance of DUT 140 in a normal operating environment. However, the inclusion of AWG 110 allows for the simulation and injection of signals that might occur in scenarios that are relatively uncommon and hard to capture during normal operations of a device.

3. VALIDATION TESTS

As indicated above, test system 100 may be configured to perform a set of one or more validation tests to evaluate the electrical performance of DUT 140. Generally, the validation tests may be performed by analyzing one or more relationships between signals being monitored over a plurality of channels. For example, the phase relationship, amplitude relationship, and/or frequency relationship between time-varying current and/or voltages captured from different test points may be evaluated. Further, the relationship between these signals and the input signal(s) provided by AWG 110, if any, to DUT 140 may also be analyzed depending on the particular test that is being performed. Based on such relationships, a variety of performance attributes may be identified as described in further detail below.

The validation tests that are performed by test system 100 may vary from implementation to implementation. According to one or more embodiments, the set of validation tests include, without limitation, logic for evaluating one or more of the following:

Transient response to step-current loads: This test measures one or more performance attributes associated with the transient response of DUT 140 when the current that is drawn by a load changes. Example performance attributes that may be captured may include, but is not limited to, the maximum and minimum signal levels (voltage and/or current) measured along one or more test points during the transient response, response timing information such as the amount of time it takes the transient response to reach steady state, and any other attribute that characterizes the transient response to the change in current.

Output response to input voltage transients: This test measures the response of an output signal when transient changes to the input voltage are injected or detected within DUT 140. Performance attributes may include the maximum and minimum signal levels of the output response, response timing information, and any other attribute that characterizes the output response.

Output impedance: This test measures the output impedance of DUT 140. In order to measure the output impedance, AWG 110 may inject an AC signal into an external excitation point electrically coupled to the output of DUT 140. Multi-channel monitoring logic 120 may be electrically coupled to a test point to monitor the output voltage and the output current responsive to the injected AC signal. The output impedance for a given frequency may then be computed by dividing the output voltage of the DUT 140 by the output current, with the DC component, if any, removed. Other techniques may also be used to determine the output impedance depending on the particular implementation. For instance, the output impedance may be determined based on the relationship between the output voltage and a reference voltage that is provided by AWG 110.

Input impedance: This test measures the input impedance of DUT 140. This test may be performed similar to the output impedance test, albeit based on time-domain measurements captured from a test point corresponding to the input of DUT 140 rather than the output. Both the input and output impedance may be computed over a wide band of frequencies based on the range of the monitoring device.

Input-to-output transfer function: This test approximates a function through which an output signal is related to the input signal of a circuit. For example, if an excitation signal is injected into the input of DUT 140, the input-to-output transfer function may be determined based at least in part on the response measured from a test point corresponding to the output of DUT 140. The test may also validate whether the observed transfer function falls within a threshold tolerance of an expected/pre-defined input-to-output transfer function. In the context of PDN designs, this test may be used to evaluate power supply transfer functions and filter transfer functions.

Output-to-input transfer function: This test approximates a function through which an input signal is related to an output signal of a circuit. For example, if an excitation signal is injected into the output of DUT 140, the output-to-input transfer function may be determined based at least in part on the response measured from a test point corresponding to the input of DUT 140. The test may also validate whether the observed transfer function falls within a threshold tolerance of an expected/predefined output-to-input transfer function. In the context of PDN designs, this test may be used to evaluate supply rail crosstalk and interactions.

In addition or as an alternative to the tests above, one or more tests directed to evaluating current sharing may be performed as described in further detail below.

As noted above, the test points that are relevant to generating test results may vary between different validation tests. For example, the test point corresponding to the output of DUT 140 may be relevant to a first set of one or more validation tests but not to a second set of one or more validation tests. Thus, when performing a particular validation task, post-processing and control logic 130 may access the set of test data that is relevant to the task at hand and ignore test data that is irrelevant.

In one or more embodiments, a set of attributes that define and control operation of the validation tests are exposed to and configurable by an end user. For example, post-processing and control logic 130 may comprise an interface, such as an application programming interface (API) or a graphical user interface (GUI), that allows a user to select which validation tests to perform for a given performance evaluation. In other words, the interface allows a user to selectively enable/disable any combination of the validation tests described herein, where a "user" in this context may be a human user, such as a power engineer, or a separate application. Further, the interface may also allow the user to optionally specify parameters for a given validation test. For instance, the "transient response to step-current loads" test may be associated with a set of configurable parameters that allow the user to specify acceptable operating voltage tolerances and the amount of current that should be drawn during the step-change. Similarly, for other tests, the user may configure the input signals that are injected into DUT 140 and the performance attributes to measure, allowing the test results to be customized by the user. If the parameters are not specified by the user, then a set of default parameters may be used.

In one or more embodiments, post-processing and control logic 130 includes logic for converting time-domain measurements into the frequency domain. For example, post-processing and control logic 130 may apply a fast Fourier (FFT) transform to compute a representation in the frequency domain of the signal information. This logic is particularly useful for validation tests that involve frequency-domain based analytics. For instance, frequency-domain based representations of the signals may be used to compute and/or plot (a) the output impedance, (b) the input-to-output transfer function, and/or (c) the output-to-input transfer function.

Figure 2A:
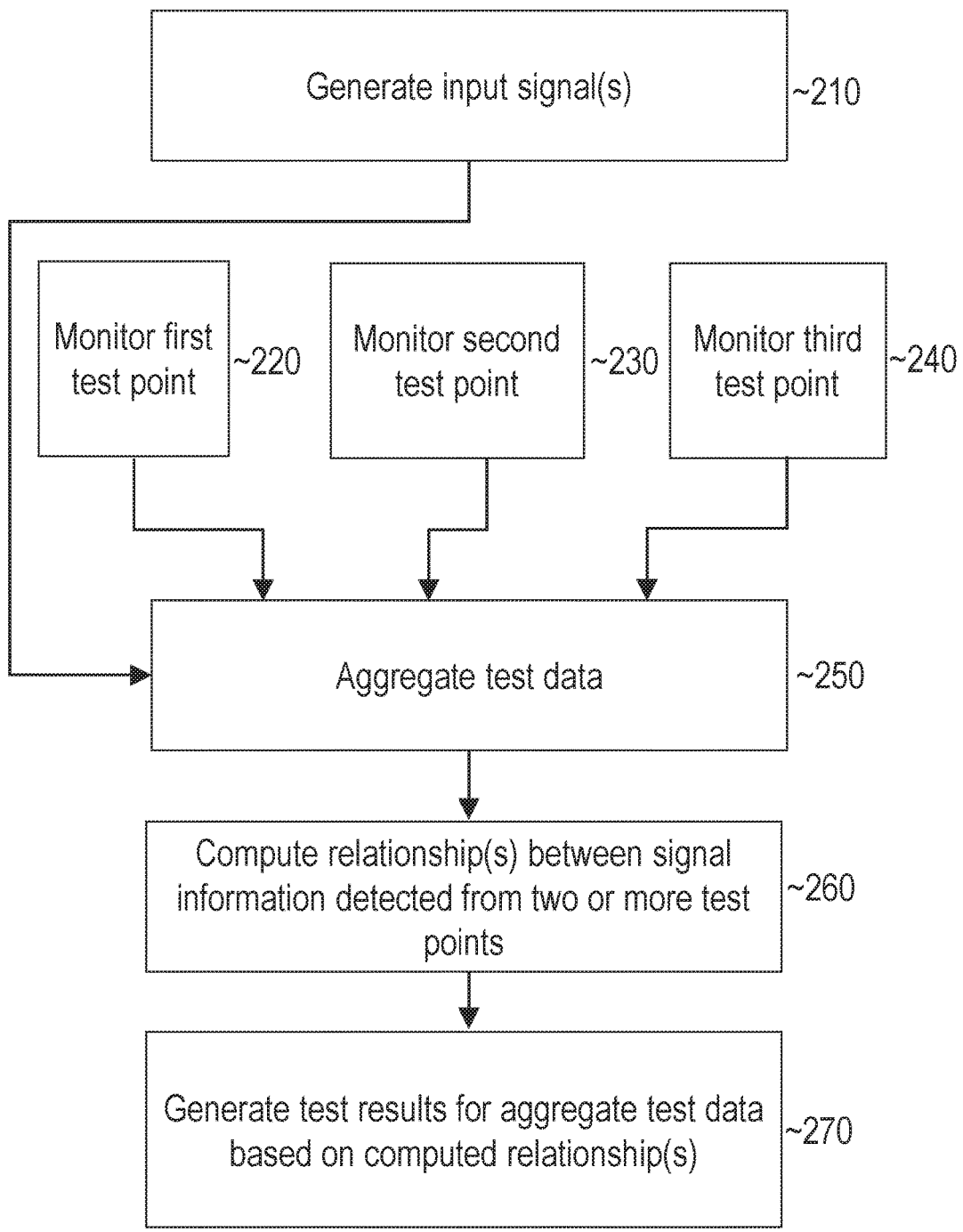
FIG. 2A illustrates an example set of operations for performing a set of validation tests in accordance with one or more embodiments.

FIG. 2A illustrates an example set of operations for performing a set of validation tests in accordance with one or more embodiments.

Initially, a user may initialize a new simulation comprising at least one validation test by (a) connecting multi-channel monitoring logic 120 to a plurality of test points within DUT 140 and (b) connecting AWG 110 to one or more excitation points within DUT 140. The user may also initialize configuration parameters that guide operation of AWG 110 and multi-channel monitoring logic 120 during the simulation. For example, the user may input a set of parameters that control the phase, amplitude, and/or magnitude of the input signals injected by AWG 110. As another example, the user may select which validation tests to perform and input performance parameters under which the DUT 140 is to be evaluated. Once the set of validation tests are initialized, then the user may trigger the set of tests. In response, AWG 110 generates a set of one or more input signals, which are provided to one or more corresponding excitation points within DUT 140 (Operation 210). As previously indicated, post-processing and control logic 130 may adjust the phase, frequency, amplitude, and/or shape of the signals over time. When a user starts the test, multi-channel monitoring logic 120 monitors one or more test points in accordance with the configuration parameters.

In an embodiment, multi-channel monitoring logic 120 concurrently monitors a first channel, a second channel, and a third channel within DUT 140 (Operations 220, 230, and 240). Multi-channel monitoring logic 120 may read configuration to determine how to monitor the separate channels. For example the configuration data may indicate a frequency range that is monitored on a channel or any other monitoring criteria.

The test points that are monitored by multi-channel oscilloscope may vary from implementation to implementation. In the context of a DC-DC converter, for example, the first channel may monitor the output voltage of the converter, a second channel may monitor the input voltage, and a third channel may monitor an internal waveform of the converter before the switch load. These three test points allow post-processing and control logic 130 to evaluate each of the tests listed above, although additional test points may also be monitored, depending on the particular implementation. For multi-phase converters, discussed in further detail below, one or more additional test points may be monitored for each additional phase to enable evaluation of current sharing within the circuit.

The electrical performance of some power conversion circuits may be more accurately evaluated if a wide band of frequencies are analyzed, including relatively low frequencies of less than 300 kHz. In order to capture these frequencies, at least one of the first channel, the second channel, and the third channel may be channels in a multi-channel high resolution oscilloscope that are configured to have a lower monitoring cutoff of below 300 kHz. In some embodiments, the lower range may go all the way down to 0 Hz. The upper cutoff of the channel may vary depending on the particular constructions and specification of the oscilloscope.

In an embodiment, multi-channel monitoring logic 120 aggregates test data that is captured over the first channel, the second channel, and the third channel (Operation 250). The test data that is aggregated may comprise any signal information that was concurrently collated from at least three test points within DUT 140. For example, the test data may aggregate frequency, phase, and amplitude information for at least three different signals monitored at corresponding test points.

Figure 2B:
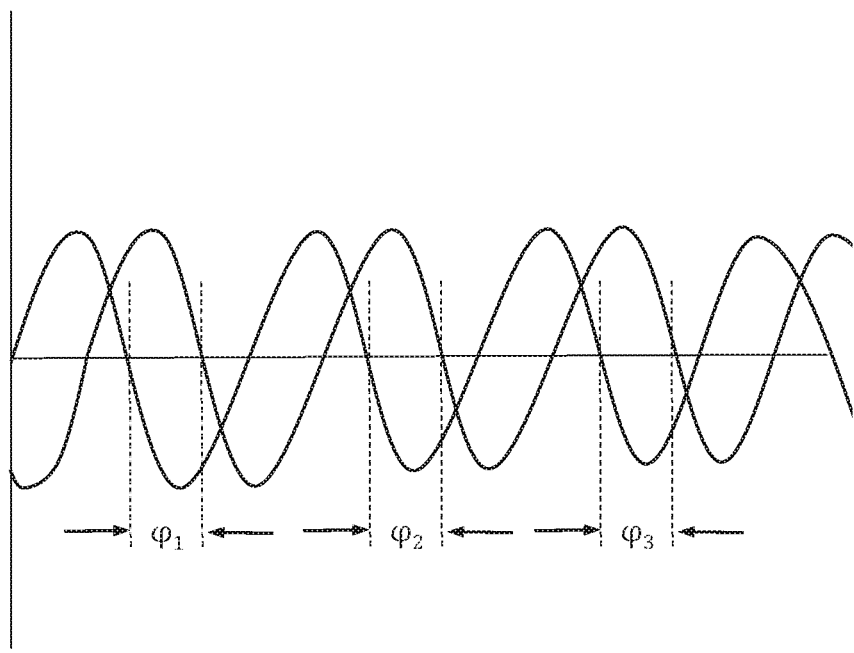
FIG. 2B illustrates an example phase relationship between two different signals in accordance with one or more embodiments.

In an embodiment, multi-channel monitoring logic 120 computes relationships between the signal information detected from two or more of the test points (Operation 260). The relationships may include, but are not limited to phase relationships, frequency relationships, and amplitude relationships. The relationship information may be determined using any aggregation function, such as summing, averaging, dividing, etc. In an example, a phase relationship is determined between two of three test points A, B, and C. A signal at a first phase is detected at test point A. A signal at a second phase then be detected. The phase relationship may be determined by computing the phase shift between the two signals. More specifically, the first phase may be subtracted from the second phase as illustrated in FIG. 2B. The phase difference may be computed at multiple points along the different signals. When the signals are perfectly synchronized, the phase shift $\varphi$ between the two signals remains constant.

In an embodiment, post-processing and control logic 130 evaluates the test data that was aggregated by multi-channel monitoring logic 120 to generate a set of test results (Operation 270). In order to generate the test results, one or more of the validation tasks described herein may be performed. The set of test results that are generated by post-processing and control logic 130 may vary depending on the particular implementation. Each test result may generally comprise performance information that is derived from a corresponding validation tests. For instance, a test results for the "transient response to step-current loads" test may include one or more performance attributes characterizing the transient response that was monitored as a current within DUT 140 stepped up or down. Similarly, a test result for the other performance tests may comprises a one or more performance attributes characterizing the electrical performance of DUT 140 for the corresponding test.

In one or more embodiments, a flag or other alert may be raised if a performance threshold is not met to alert the end user. For example, an alert may be generated if a voltage tolerance is exceeded, if the impedance levels do not satisfy a performance threshold, if the performance of a transfer function does not satisfy a threshold, etc.

In one or more embodiments, the set of test results is generated within volatile and/or non-volatile storage. In addition, the test results may be displayed in any format to an end user. For example, an alert may indicate which performance test failed and the cause of the failure. In other cases, waveforms and/or performance attributes for multiple validation tests may be concurrently displayed so that the user may concurrently view the results of different tests. If the results of multiple tests are concurrently displayed, the user may drill down to a particular test to analyze the test data that is relevant to that particular test. This allows the user to quickly navigate through various electrical performance results associated with a PDN design using a single interface.

4. PERFORMANCE EVALUATION OF MULTI-PHASE POWER SUPPLIES

In addition or as an alternative to each of the validation tests described above, the set of validation tests may include, but is not limited to evaluating current sharing and tracking to load current transients. In the context of PDNs, multi-phase power converters are typically engineered to balance currents between a plurality of different phases. A "phase" in this context, which is used differently than in the context of a signal, corresponds to an individual, switch-controlled converter circuit that is electrically coupled in parallel with one or more other switch-controlled converter circuits. Each of the individual converter circuits/phases is switched on at equally spaced time intervals to provide a desired output voltage. With multiple phases, the converter is able to respond more quickly to changing loads, which is especially useful in microprocessors and other integrated circuits where loads changes frequently.

The performance of multi-phase power converters is often dependent on current sharing between different phases. In an ideal circuit, the current is balanced evenly across the n phases in the converter, with the phase of the output signal at each "phase" in the converter being offset at equally spaced intervals. In other words, each phase of the converter is switched on at a different phase and has an output current/voltage with a different phase. Typically, current balancing is controlled by means of a current or voltage sensing control loop that adjusts the current drawn by each of the phases, although other balancing circuitry may also be used depending on the particular design of the converter. Even with current control loops, current imbalance may be introduced through a variety of sources including, without limitation, load current transients, impedance differences between the phases, and/or undesired tolerance levels in the control loop.

In scenarios where DUT 140 includes or corresponds to a multi-phase power converter, a separate channel may connect each phase of the converter to multi-channel monitoring logic 120. As previously described, with a single phase converter the validation tests listed above may be performed using three connections. For a multi-phase converter, an additional connection may be added for each additional phase of the converter. In other words, n+2 channels may be used to monitor n phases in a multi-phase converter. Thus, in a two phase converter, four test points may be monitored: one corresponding to the input, another corresponding to the output, and one for each phase of the converter. In multi-phase converters where the inputs of phases are not directly connected together, 2n+1 channels may be used: n channels to monitor the switching waveform of each phase, n channels to monitor the input voltages of each phase and one channel to monitor the output.

In one or more embodiments, frequency-based testing of current balance in a multi-phase converter is performed by applying a changing load current to one or more external excitation points on DUT 140. As the load current is changing, the current signal at each phase within the converter is concurrently monitored by multi-channel monitoring logic 120. The captured signal information is then converted by post-processing and control logic 130 to a frequency representation. Once the frequency representations are generated, post-processing and control logic 130 compares the amplitude of the different frequencies of the signal at each phase of the converter to measure the differences. Magnitude differences that exceeds a threshold level are indicative of current imbalance In addition or as an alternative the above, the current balance in a multi-phase converter may be tested by summing the magnitudes of the signals and/or comparing the phase relationships between different signals. In the former test, the sum of the magnitudes across each phase may be compared to a target value and a flag may be raised if the sum differs from the target value by more than a threshold amount. In the phase-relationship testing, the phase differences between the signals may be compared to a target phase difference. Unexpected phase variations that negatively affect the performance of the converter may be identified and presented to a user.

In one or more embodiments, post-processing and control logic 130 is configured to present a set of results for the frequency-based testing of current balance. The results that are presented may vary depending on the particular implementation. As an example, post-processing and control logic 130 may plot and display the frequency response and/or the phase of each monitored signal to provide a quick visual comparison between the different converter phases. Post-processing and control logic 130 may also generate an alert of any magnitude and/or phase differences that are associated with current imbalance to highlight potential issues within converter design. Other performance attributes and the results of other validation tests may also be displayed concurrently.

Figure 3:
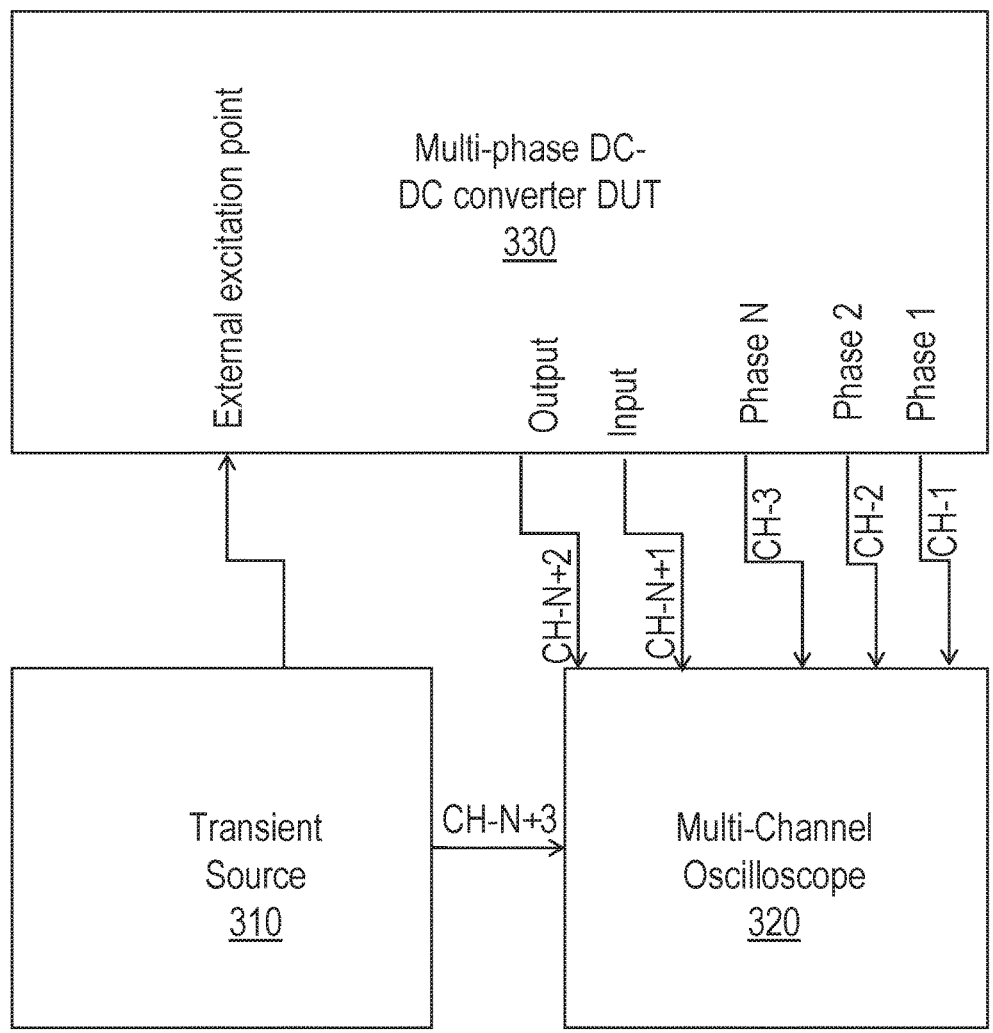
FIG. 3 illustrates a system for testing current balance among multiple phases of a multi-phase power converter, in accordance with one or more embodiments.

FIG. 3 illustrates an example setup for testing current balance among multiple phases of a multi-phase power converter, in accordance with one or more embodiments. The test system in this example generally comprises transient source 310 and multi-channel oscilloscope 320. Transient source 310 is electrically coupled to an excitation point within multi-phase DC-DC converter DUT 330 and injects a transient source at the external excitation point. Multi-channel oscilloscope 320 monitors each phase of the converter as well as the input and output. Multi-channel oscilloscope may include an additional phase electrically coupled to transient source 310 to monitor the transient waveforms that are injected into the DUT. Based on the monitored data, a set of test results may be generated as previously described.

The accuracy of the results of current balance testing may be enhanced by using a high-resolution multi-channel oscilloscope. This device captures data at a relatively fine-level of detail over a wide range of frequencies. With resolutions of 12-bits or greater, for instance, frequency-domain based representations of the time-domain measurements may be computed, even at near-zero frequencies, with a relatively high degree of accuracy when compared against traditional 8-bit oscilloscopes or even frequency-domain based measuring tools. The higher quality frequency-domain representations of current signals across different phases provide for a more accurate comparison of amplitudes at various frequencies, including those less than 300 kHz.

5. HARDWARE OVERVIEW

According to one or more embodiment, the post-processing and control logic described herein are implemented by one or more special-purpose computing devices. The special-purpose computing devices may be hard-wired to perform the techniques, or may include digital electronic devices such as one or more application-specific integrated circuits (ASICs) or field programmable gate arrays (FPGAs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, portable computer systems, handheld devices, networking devices or any other device that incorporates hard-wired and/or program logic to implement the techniques.

Figure 4:
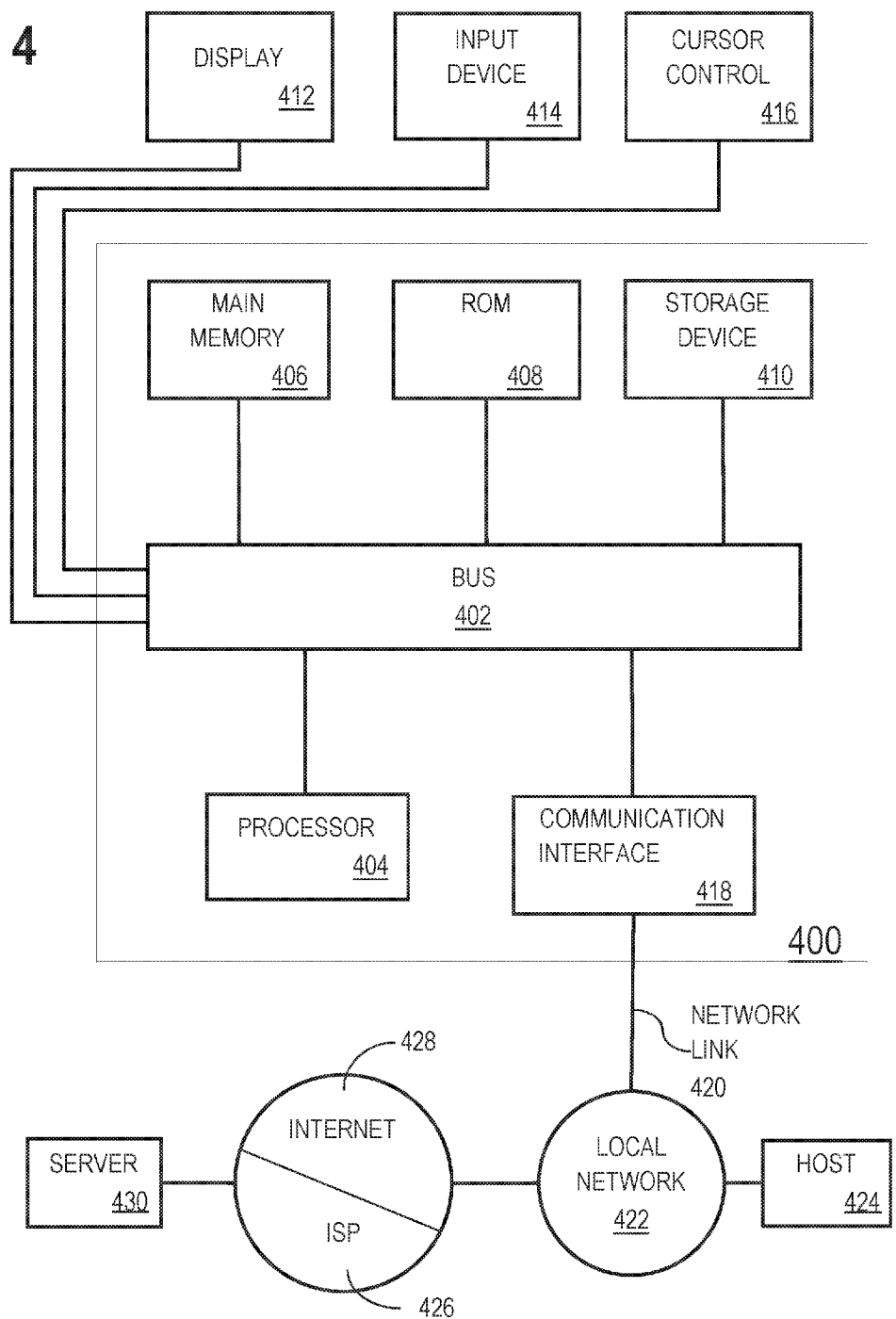
FIG. 4 illustrate an example computer system on which one or more embodiments may be implemented.

For example, FIG. 4 is a block diagram that illustrates computer system 400 upon which one or more embodiments may be implemented. Computer system 400 includes bus 402 or other communication mechanism for communicating information, and hardware processor 404 coupled with bus 402 for processing information. Hardware processor 404 may be, for example, a general purpose microprocessor.

Computer system 400 also includes main memory 406, such as a random access memory (RAM) or other dynamic storage device, coupled to bus 402 for storing information and instructions to be executed by processor 404. Main memory 406 also may be used for storing temporary variables or other intermediate information during execution of instructions to be executed by processor 404. Such instructions, when stored in non-transitory storage media accessible to processor 404, render computer system 400 into a special-purpose machine that is customized to perform the operations specified in the instructions.

Computer system 400 further includes read only memory (ROM) 408 or other static storage device coupled to bus 402 for storing static information and instructions for processor 404. Storage device 410, such as a magnetic disk or optical disk, is provided and coupled to bus 402 for storing information and instructions.

Computer system 400 may be coupled via bus 402 to display 412, such as a cathode ray tube (CRT), liquid crystal display (LCD), or light-emitting diode (LED), for displaying information to a computer user. Input device 414, which may include physical and/or touchscreen based alphanumeric keys, is coupled to bus 402 for communicating information and command selections to processor 404. Another type of user input device is cursor control 416, such as a mouse, a trackball, or cursor direction keys for communicating direction information and command selections to processor 404 and for controlling cursor movement on display 412. This input device typically has two degrees of freedom in two axes, a first axis (e.g., x) and a second axis (e.g., y), that allows the device to specify positions in a plane.

Computer system 400 may implement the techniques described herein using customized hard-wired logic, one or more ASICs or FPGAs, firmware and/or program logic which in combination with the computer system causes or programs computer system 400 to be a special-purpose machine. According to one embodiment, the techniques herein are performed by computer system 400 in response to processor 404 executing one or more sequences of one or more instructions contained in main memory 406. Such instructions may be read into main memory 406 from another storage medium, such as storage device 410. Execution of the sequences of instructions contained in main memory 406 causes processor 404 to perform the process steps described herein. In alternative embodiments, hard-wired circuitry may be used in place of or in combination with software instructions.

The term "storage media" as used herein refers to any non-transitory media that store data and/or instructions that cause a machine to operation in a specific fashion. Such storage media may comprise non-volatile media and/or volatile media. Non-volatile media includes, for example, optical or magnetic disks, such as storage device 410. Volatile media includes dynamic memory, such as main memory 406. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 402. Transmission media can also take the form of acoustic or light waves, such as those generated during radio-wave and infra-red data communications.

Various forms of media may be involved in carrying one or more sequences of one or more instructions to processor 404 for execution. For example, the instructions may initially be carried on a magnetic disk or solid state drive of a remote computer. The remote computer can load the instructions into its dynamic memory and send the instructions over a telephone line using a modem. A modem local to computer system 400 can receive the data on the telephone line and use an infra-red transmitter to convert the data to an infra-red signal. An infra-red detector can receive the data carried in the infra-red signal and appropriate circuitry can place the data on bus 402. Bus 402 carries the data to main memory 406, from which processor 404 retrieves and executes the instructions. The instructions received by main memory 406 may optionally be stored on storage device 410 either before or after execution by processor 404.

Computer system 400 also includes a communication interface 418 coupled to bus 402. Communication interface 418 provides a two-way data communication coupling to a network link 420 that is connected to local network 422. For example, communication interface 418 may be an integrated services digital network (ISDN) card, cable modem, satellite modem, or a modem to provide a data communication connection to a corresponding type of telephone line. As another example, communication interface 418 may be a local area network (LAN) card to provide a data communication connection to a compatible LAN. Wireless links may also be implemented. In any such implementation, communication interface 418 sends and receives electrical, electromagnetic or optical signals that carry digital data streams representing various types of information.

Network link 420 typically provides data communication through one or more networks to other data devices. For example, network link 420 may provide a connection through local network 422 to host computer 424 or to data equipment operated by Internet Service Provider (ISP) 426. ISP 426 in turn provides data communication services through the world wide packet data communication network now commonly referred to as the "Internet" 428. Local network 422 and Internet 428 both use electrical, electromagnetic or optical signals that carry digital data streams. The signals through the various networks and the signals on network link 420 and through communication interface 418, which carry the digital data to and from computer system 400, are example forms of transmission media.

Computer system 400 can send messages and receive data, including program code, through the network(s), network link 420 and communication interface 418. In the Internet example, server 430 might transmit a requested code for an application program through Internet 428, ISP 426, local network 422 and communication interface 418.

The received code may be executed by processor 404 as it is received, and/or stored in storage device 410, or other non-volatile storage for later execution.

6. MISCELLANEOUS; EXTENSIONS

Embodiments are directed to a system with one or more devices that include a hardware processor and that are configured to perform any of the operations described herein and/or recited in any of the claims below.

In an embodiment, a non-transitory computer readable storage medium comprises instructions which, when executed by one or more hardware processors, causes performance of any of the operations described herein and/or recited in any of the claims.

Any combination of the features and functionalities described herein may be used in accordance with one or more embodiments. In the foregoing specification, embodiments have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction.

What is claimed is:

1. A system comprising:
    an automatic waveform generator (AWG) that couples to one or more excitation points of a Device Under Test (DUT) and transmits a plurality of different test signals to the DUT at different times through the one or more excitation points;
    a waveform monitoring device including at least one hardware processor and a plurality of input channels, including a first channel, a second channel, and a third channel for concurrently monitoring at least three different test points of the DUT while the plurality of different test signals are transmitted to the DUT,
        wherein the first channel couples via a first probe to a first test point corresponding to a first phase of a multiphase power converter in the DUT,
        wherein the second channel couples via a second probe to a second test point corresponding to, a second phase of the multiphase power converter in the DUT,
        wherein the third channel couples via a third probe to a third test point corresponding to one of an input or an output of the multiphase power converter in the DUT,
        wherein the first phase is different from the second phase;
    post processing logic that:
        aggregates test data comprising signal information collected, by the waveform monitoring device, concurrently from the at least three different test points of the DUT;
        based on the aggregated test data, determines a relationship between two or more of the first phase, the second phase, and at least one of the input or the output of the multiphase power converter in the DUT; and
        generates and outputs a set of test results based at least on the relationship, wherein the set of test results indicate whether the multiphase power converter in the DUT satisfies a plurality of performance thresholds.

2. The system of claim 1, wherein the waveform monitoring device is a multi-channel oscilloscope with a resolution of at least twelve bits.

3. The system of claim 1, wherein the system is configured to execute control software comprising functionality to configure the automatic waveform generator transmitting the plurality of different test signals to the DUT.

4. The system of claim 1, wherein the post-processing logic includes software comprising functionality to generate and display waveforms on a display.

5. The system of claim 1, wherein the post-processing logic is configured to execute software comprising functionality to determine a phase relationship between signals detected in the first phase and the second phase of the multiphase power converter and process the test data based on the phase relationship.

6. The system of claim 1, wherein the post-processing logic is configured to execute software comprising functionality to determine an amplitude relationship between two or more of the first phase, the second phase, the input and the output of the multiphase power converter, and process the test data based on the amplitude relationship.

7. The system of claim 1, wherein the DUT comprises at least one linear circuit.

8. The system of claim 1, wherein the system is configured for testing of non-linear circuits of the DUT.

9. The system of claim 1, wherein the system is configured for frequency-domain testing of current sharing of multi-phase power sources, wherein the set of test results include results for two or more of a transient response to step-current load test, an output response to input voltage transient test, an output impedance test, an input impedance test, an input-to-output transfer function test, or an output-to-input transfer function test.

10. The system of claim 1, wherein the AWG is configured to change at least one of a phase, frequency or amplitude when sweeping between different test signals of the plurality of test signals.

11. The system of claim 1, wherein the system is configured to execute software comprising functionality to evaluate a first electrical performance using a first subset of test data from the aggregated test data; wherein the system is configured to evaluate a second electrical performance using a second subset of test data from the aggregated test data; wherein the first subset of test data is different than the second subset of test data.

12. The system of claim 1, wherein the DUT is the multiphase power converter.

13. A method comprising:
    transmitting, by an automatic waveform generator (AWG) through one or more excitation points of a Device Under Test (DUT), a plurality of different test signals at different times;
    concurrently monitoring, using a single waveform monitoring device, at least three different test points of the DUT while the plurality of different test signals are transmitted to the DUT, wherein monitoring comprises:

monitoring, at a first test point corresponding to a first phase of a multiphase power converter in the DUT, a first channel to detect a first signal;

monitoring, at a second test point corresponding to a second phase of the multiphase power converter in the DUT, a second channel to detect a second signal;

monitoring, at a third test point corresponding to one of an input or an output of the multiphase power converter in the DUT, a third channel to detect a third signal;

wherein the first phase is different from the second phase;

aggregating test data comprising signal information collected concurrently from the at least three different test points of the DUT;

based on the aggregated test data, determining a relationship between two or more of the first phase, the second phase, and at least one of the input or the output of the multiphase power converter in the DUT;

generating test results based at least on the relationship, wherein the set of test results indicate whether the multiphase power converter in the DUT satisfies a plurality of performance thresholds.

14. The method of claim 13, wherein the waveform monitoring device is a multi-channel oscilloscope with a resolution of at least twelve bits.

15. The method of claim 13, wherein the set of test results include results for two or more of a transient response to step-current load test, an output response to input voltage transient test, an output impedance test, an input impedance test, an input-to-output transfer function test, or an output-to-input transfer function test.

16. The method of claim 13, further comprising determining a phase relationship between two or more of the first signal, the second signal, and the third signal, and processing the test data based on the phase relationship.

17. The method of claim 13, further comprising determining an amplitude relationship between two or more of the first signal, the second signal, and the third signal, and processing the test data based on the amplitude relationship.

18. The method of claim 13, further comprising testing an electrical performance of at least one nonlinear circuit within the DUT.

19. The method of claim 13, wherein the AWG is configured to change at least one of a phase, frequency or amplitude when sweeping between different test signals of the plurality of test signals.

20. The method of claim 13, wherein the test results include a first result of evaluating a first electrical performance using a first subset of test data from the aggregated test data and a second result of evaluating a second electrical performance using a second subset of test data from the aggregated test data; wherein the first subset of test data is different than the second subset of test data.

* * * * *

UNITED STATES PATENT AND TRADEMARK OFFICE
CERTIFICATE OF CORRECTION

PATENT NO. : 10,126,374 B2
APPLICATION NO. : 15/215280
DATED : November 13, 2018
INVENTOR(S) : Novak Page 1 of 1

It is certified that error appears in the above-identified patent and that said Letters Patent is hereby corrected as shown below:

In the Specification

In Column 3, Line 59, delete "amplitude." and insert -- amplitude, --, therefor.

In Column 6, Line 30, delete "waveform," and insert -- waveform. --, therefor.

In Column 12, Line 5, delete "imbalance" and insert -- imbalance. --, therefor.

Signed and Sealed this
Fifth Day of November, 2019

Andrei Iancu
*Director of the United States Patent and Trademark Office*